(12) United States Patent
Nakanishi et al.

(10) Patent No.: US 8,518,613 B2
(45) Date of Patent: Aug. 27, 2013

(54) OPTICAL MEMBER BASE MATERIAL FOR EUV LITHOGRAPHY, AND METHOD FOR PRODUCING SAME

(75) Inventors: Hiroshi Nakanishi, Tokyo (JP); Yoshiaki Ikuta, Tokyo (JP)

(73) Assignee: Asahi Glass Company, Limited, Tokyo (JP)

(\*) Notice: Subject to any disclaimer, the term of this patent is extended or adjusted under 35 U.S.C. 154(b) by 0 days.

(21) Appl. No.: 13/618,503

(22) Filed: Sep. 14, 2012

(65) Prior Publication Data

US 2013/0011773 A1 Jan. 10, 2013

Related U.S. Application Data

(63) Continuation of application No. PCT/JP2011/056096, filed on Mar. 15, 2011.

(30) Foreign Application Priority Data

Mar. 16, 2010 (JP) ................................ 2010-059199

(51) Int. Cl.
*G03F 1/60* (2012.01)
*B24B 1/00* (2006.01)
*C03C 17/00* (2006.01)
*C03C 19/00* (2006.01)

(52) U.S. Cl.
USPC .......... 430/5; 65/60.1; 65/61; 451/36; 451/41

(58) Field of Classification Search
USPC ................. 430/5, 30; 65/60.1, 61; 378/35; 428/428, 430; 451/36, 41
See application file for complete search history.

(56) References Cited

U.S. PATENT DOCUMENTS

| | | | |
|---|---|---|---|
| 6,951,502 B2 | 10/2005 | Koike et al. | |
| 7,923,178 B2 * | 4/2011 | Ito et al. | 430/5 |
| 8,070,557 B2 | 12/2011 | Kojima et al. | |
| 2004/0192171 A1 | 9/2004 | Koike | |
| 2007/0125747 A1 | 6/2007 | Otsuka et al. | |
| 2008/0311487 A1 | 12/2008 | Ito et al. | |
| 2009/0017387 A1 | 1/2009 | Shoki | |

FOREIGN PATENT DOCUMENTS

| | | |
|---|---|---|
| JP | 8-321489 | 12/1996 |
| JP | 10-286771 | 10/1998 |
| JP | 2003-505891 | 2/2003 |
| JP | 2004-29735 | 1/2004 |
| JP | 2004-291209 | 10/2004 |
| JP | 2004-310067 | 11/2004 |
| JP | 2006-8246 | 1/2006 |
| JP | 2006-176341 | 7/2006 |
| JP | 2007-114336 | 5/2007 |
| JP | 2007-213020 | 8/2007 |
| JP | 2008-27992 | 2/2008 |
| JP | 2008-103481 | 5/2008 |
| JP | 2009-12164 | 1/2009 |
| WO | 01/07967 | 2/2001 |
| WO | 02/060646 | 8/2002 |

OTHER PUBLICATIONS

International Search Report issued Apr. 26, 2011 in PCT/JP2011/056096, filed Mar. 15, 2011.
Sugiyama et al., "Current Status of EUVL Mask Blank Development in AGC", International Symposium on Extreme Ultraviolet Lithography Oct. 2006 (20 pgs.).
Semi P40-1103 © Semi 2003, "Specification for Mounting Requirements and Alignment Reference Locations for Extreme Ultraviolet Lithography Masks", 2003 (6 pgs.).
Semi P-37-1102 © Semi 2001, 2002, "Specification for Extreme Ultraviolet Lithography Mask Substrates", 2001, 2002 (10 pgs.).
J. Sohn, Sematech Inc.. "Flatness Compensation Updates/Challenges", IEUVI Mask TWG Meetings Oct. 2009, (17 pgs.).
Ling et al., "Strategy and Feasibility of Defect-free Mask Fabrication to enable EUVL", International Symposium on Extreme Ultraviolet Lithography, 2009 (20 pgs.).
Sohn et al., "Implementing E-beam correction Strategies for Compensation of EUVL Mask Non-flatness", International Symposium on Extreme Ultraviolet Lithography, Nov. 2009 (20 pgs.).

\* cited by examiner

*Primary Examiner* — Christopher Young
(74) *Attorney, Agent, or Firm* — Oblon, Spivak, McClelland, Maier & Neustadt, L.L.P.

(57) ABSTRACT

The present invention relates to a method for producing an optical member base material for EUVL, comprising performing the following in this order to obtain an optical member base material for EUVL: a preliminary-polishing step of preliminarily polishing a film forming surface and a back surface of the film forming surface of a glass substrate; a measuring step of measuring a total thickness distribution and a flatness of the glass substrate; and a corrective-polishing step of locally polishing only the back surface of the glass substrate depending on the measurement result of the measuring step.

19 Claims, 4 Drawing Sheets

FIG. 5
(a)
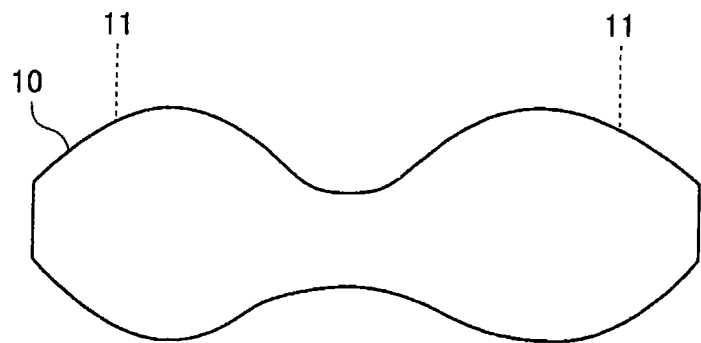
(b)
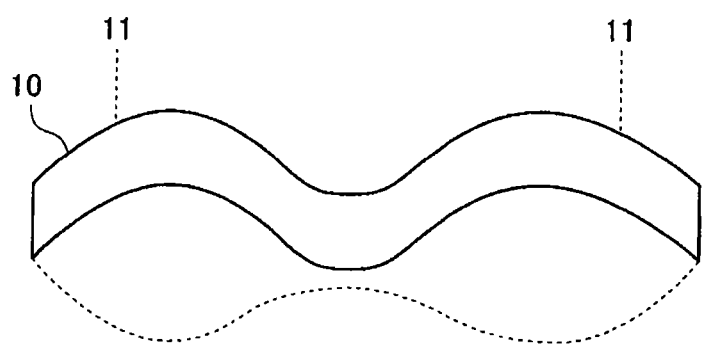
FIG. 6
(a)          (b)
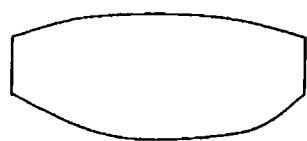  

(a)  (b)  (c)

(a)  (b)

OPTICAL MEMBER BASE MATERIAL FOR EUV LITHOGRAPHY, AND METHOD FOR PRODUCING SAME

TECHNICAL FIELD

The present invention relates to an optical member base material for EUV (Extreme Ultra Violet) lithography and a method for producing the same.

BACKGROUND ART

Heretofore, in the lithography technique, an exposure apparatus for manufacturing a semiconductor device by transferring a fine circuit pattern onto a wafer has been widely employed. Along with improving in high-integration, high-speed, and low power consumption of the semiconductor device have progressed, microsizing of the semiconductor device has advanced. In response to this trend, an exposure apparatus is required to image a fine circuit pattern of a semiconductor device on a wafer surface in a deeper focal length, and shortening in wavelength of the exposure light source has progressed. Specifically, for light used as the exposure light source, ultraviolet light of ArF excimer laser (wavelength of 193 nm) has been employed, further advancing form conventional g-line (wavelength of 436 nm), i-line (wavelength of 365 nm), or KrF excimer laser (wavelength of 248 nm). However, also in the lithography technique using such light with a wavelength of 193 nm, only semiconductor devices with circuit dimensions of 32 nm to 45 nm can be made, and development of a technique for making a semiconductor device with circuit dimensions of 30 nm or less is required. On the basis of such background, attention has been paid to the lithography technique using extreme ultraviolet light (EUV light) as a viable candidate, and development thereof has been actively performed. EUV light means light having a wavelength band in a soft X-ray area or a vacuum ultraviolet area, and specifically, light with a wavelength of about 0.2 nm to 100 nm. At the present point, use of light in the vicinity of 13.5 nm is mostly considered as the light source of lithography.

The exposure principle of the EUV lithography (hereinafter, abbreviated to "EUVL") is identical with that of the conventional lithography in that a mask pattern is reduced-projected on a wafer by using a projection optical system, however, since there is no material through which light transmits in the EUV light energy region, a transmission refractive optical system using a transmission-type photomask which is generally used in an exposure apparatus having a light source of light with a wavelength of 193 nm to 436 nm cannot be used, and a reflecting optical system is used (refer to Patent Literature 1). An optical member of the reflecting optical system is constituted by a reflective photomask and a plurality of reflective mirrors, and is configured to reduced-project a pattern formed on the mask onto a resist formed on a wafer, to a rate of ¼ to ⅕ times thereof, through the reflective mirrors.

Herein, the reflective photomask is an optical member (EUVL optical member) obtained from, for example, a plurality of procedures described below.

First, a first procedure is to prepare a glass substrate which has a smooth and flat surface with extremely low roughness and without unevenness, as a base material for an optical member (optical member base material for EUVL). As such a glass substrate, it is required to have a low thermal expansion property so as not to cause expansion or contraction thereof by temperature changes even under EUV light irradiation, and hence, a substrate made of glass having a low thermal expansion coefficient (silica glass ($SiO_2$ glass) or $TiO_2$-containing silica glass (hereinafter, described as $TiO_2$—$SiO_2$ glass in the present specification) is generally used.

A second procedure is to prepare an ML blank in which a reflective layer reflecting EUV light is made on a surface of the glass substrate (film forming surface) on which a mask pattern is finally formed. As the reflective layer, a multilayered reflection film (ML film), in which high-refractive layers for EUV light (e.g., Si) and low-refractive layers (e.g., Mo) are stacked alternatively and thereby improving light reflectance at the time of irradiating the surface of the reflective layer with EUV light, is generally used. In addition, in order to prevent deterioration of the multilayered reflective film, a protective layer (e.g., Ru) is generally formed on the ML film.

Next, a third procedure is to form an absorber layer (e.g., Ta or TaN) that absorbs EUV light on the ML film of the ML blank (or on the protective layer when the protective layer has been formed). If necessary, an antireflection layer (e.g., TaON or TaO) having a low reflectance in a wavelength of mask pattern inspection light may be formed on the absorber layer.

It is a mask blank that obtained by forming an absorber layer and, if necessary, an antireflection layer on an ML blank.

A final fourth procedure is to form a mask pattern is formed by etching away a part of the absorber layer (or the absorber layer and the antireflection layer when the antireflection layer is formed on the absorber layer) of the mask blank, by using a resist or the like, so as to project on a wafer EUV light having desired light intensity distribution. It is a reflective photomask that has a portion at which a mask pattern is formed on the absorber layer (or the absorber layer and the antireflection layer when the antireflection layer is formed on the absorber layer) so that the reflective layer (or the protective layer when the protective layer is formed on the reflective layer) is exposed to reflect EUV light thereon thus obtained, and a portion at which the reflective layer (or the protective layer when the protective layer is formed on the reflective layer) is covered by the absorber layer (or the absorber layer and the antireflection layer when the antireflection layer is formed on the absorber layer) so that EUV light is hardly reflected thereon (refer to Non Patent Literature 1). Herein, a method for forming a mask pattern includes a series of steps of, for example, (1) forming a resist film on the absorber layer of the mask blank (or the absorber layer and the antireflection layer when the antireflection layer is formed on the absorber layer), (2) drawing a mask pattern on the resist film using a lithography device having a light source of an electron beam or ultraviolet ray in the state of holding the mask blank in a mechanical way such as clamping an end face or the vicinity of the outer circumference portion of the front and back surfaces of the mask blank, (3) removing the resist film in unnecessary portions, (4) etching the absorber layer (or the absorber layer and the antireflection layer when the antireflection layer is formed on the absorber layer) exposed due to the removal of the resist film, and (5) removing the remaining resist film.

In addition, a conductive film with sheet resistance of 100Ω or less (e.g., CrN, Cr, CrO, or TaN) is formed on a face where the mask pattern is not formed (hereinafter, referred as a "back surface"), in the case of a reflective photomask.

However, in an exposure apparatus using EUV light as the light source, a reflective photomask is adsorption-held by an electrostatic chuck by utilizing a conductive film which is formed on the back surface thereof, and a mask pattern that is formed on the film forming surface thereof is reduced-projected, and transferred onto a resist film on a wafer. At this moment, since all of the film forming surface and the back surface of the reflective photomask and the surface of the electrostatic chuck are not perfectly flat, the reflective photomask is adsorbed to the electrostatic chuck in the state of being deformed along the shape of the surface of the electrostatic chuck, substantially without causing a gap between the back surface of the reflective photomask and the surface of the electrostatic chuck. On the other hand, the mask pattern on the reflective photomask is formed by using a lithography device such as an electron beam or the like as described above, and the method for holding the reflective photomask in the lithography device is mechanical holding on the end face or the outer circumference, not by the electrostatic chuck. Thus, a mask pattern on the reflective photomask is formed in the state without deformation due to adsorption to the electrostatic chuck that occurs in an exposure apparatus. For this reason, if the reflective photomask is deformed at the time of being adsorbed to the electrostatic chuck in the exposure apparatus, the formation position of a pattern transferred onto a resist on a wafer is different from the formation position of a pattern on the reflective photomask formed using the lithography device. The pattern transferred on a resist on a wafer has to be satisfactorily and accurately copied from the pattern on the reflective photomask that is the original pattern, except for being reduced to 1/4 to 1/5 times, which is the projection magnification of the exposure apparatus. Therefore, it is a problem that a deviation of the pattern formation position caused by deformation of the reflective photomask due to the electrostatic chuck adsorption in the exposure apparatus as described above fails to acquire intended transfer accuracy.

For this reason, it is preferable that the deformation of the reflective photomask when being adsorption-held by the electrostatic chuck in the exposure apparatus be as small as possible. For this, it is preferable that both of (1) flatness of the surface of the electrostatic chuck and (2) flatness of the film forming surface and back surface of the glass substrate be as low as possible. In addition, it is preferable, in the exposure apparatus, that the shape of the film forming surface of the reflective photomask being adsorption-held by the electrostatic chuck be the same as the shape of the film forming surface of the reflective photomask being held in the lithography device for forming a mask pattern. For this, it is necessary to extremely reduce both (3) total thickness distribution (generally, TTV) of the glass substrate and (4) the gap between the surface of the electrostatic chuck and the back surface of the reflective photomask. The requirement (4) is inevitably reduced if the requirements (1) and (2) become lower. For this reason, very strenuous demands are made on the requirement (1) of flatness of the surface of an electrostatic chuck to be 40 nm or less (Table 1 of Non Patent Literature 2), and both of the requirement (2) of flatness of the film forming surface and the back surface of the glass substrate and the requirement (3) of total thickness distribution of the glass substrate to be 100 nm or less, preferably 30 nm or less together (Table 4 of Non Patent Literature 3). Such strenuous demands for the glass substrate are specific for the reflective photomask held by using an electrostatic chuck during exposure, in other words, specific for a mask blank for EUVL.

As a method for processing a glass substrate for realizing such strenuous demands, as disclosed in Patent Literatures 2 to 4, various local polishing methods which are for selectively and locally polishing only part of the film forming surface and/or back surface of the glass substrate, have been proposed. In such methods, however, it was problematic in that both of the total thickness distribution of the glass substrate and flatness of the film forming surface and back surface of the glass substrate could not be certainly satisfied at the same time. In addition, Patent Literature 5 has proposed a method for obtaining a glass substrate being excellent in flatness and total thickness distribution by simultaneously polishing the entire substrate surface, which is called an entire surface polishing method. According to the proposal, by locally controlling a substrate pushing pressure during polishing, the speed of polishing is locally adjusted so as to obtain a desired surface profile, and therefore, a glass substrate having both of such excellent flatness and total thickness distribution that flatness of the film forming surface and back surface be 40 to 50 nm or less and total thickness distribution be 50 nm or less, is obtained.

However, even when the above-described proposed various methods are used, both demands of flatness and total thickness distribution of the glass substrate are very strict and it is extremely difficult to meet both demands at the same time, and thus, a method in which formation position of a mask pattern is adjusted on the basis of the flatness of the glass substrate, when a mask pattern is drawn by using an electron beam, or the like, on a reflective photomask, has been proposed (Non Patent Literatures 4 and 6). If this method is applied, the demand on flatness of the glass substrate is moderated to 300 nm or lower, and the demand on the total thickness distribution is not particularly required. However, the adjustment amount of pattern position during drawing a mask pattern depends on the total thickness distribution of the glass substrate, and the adjustment amount of pattern position during electron beam drawing may become smaller as the total thickness distribution of the glass substrate becomes smaller, and therefore, excellent transfer accuracy during implementation of EUVL is stably obtained. Specifically, in the case of the glass substrate having flatness of 300 nm described in Non Patent Literatures 4 and 5, the total thickness distribution thereof can be a very large value of 600 nm to the maximum. For this reason, even when flatness of the glass substrate is moderated from 100 nm or lower that is a conventional demand and becomes 300 nm or lower, it is preferable that the total thickness distribution of the glass substrate be as small as possible since the adjustment amount of pattern position during drawing a mask pattern may be small and excellent transfer accuracy during implementation of EUVL is stably obtained.

Furthermore, for the glass substrate, in addition to flatness of the film forming surface and back surface and total thickness distribution, as mentioned in Table 5 of Non Patent Literature 3, it is required to have no defects such as scratches or streaks of which the depth is 1 nm or more, and have no defect such as minute unevenness of which the size converted to a polystyrene latex particle diameter is 50 nm or larger on the film forming surface. Recently, it is required to have no serious defect, such that the influence of the defect on the glass substrate cannot be reduced by correction of a mask pattern, on the film forming surface. As a specific example, Non Patent Literature 5 reports that a defect having a height of 120 nm cannot be reduced its influence by correction of a mask pattern, and it is strongly required to have, on the surface, no concave defect such as a scratch, a streak, or a pit or convex defect such as foreign substances attached to the surface, having a relatively large size converted to a polystyrene latex particle diameter of 150 nm or larger.

In other words, it is required to provide a glass substrate, which has small flatness for the film forming surface and back surface, has small total thickness distribution, and has no remarkable scratch, streak, or the like, and of which a mask pattern can be corrected.

CITATION LIST

Patent Literature

PATENT LITERATURE 1: JP-T-2003-505891
PATENT LITERATURE 2: JP-A-8-321489
PATENT LITERATURE 3: JP-A-10-286771
PATENT LITERATURE 4: JP-A-2004-310067
PATENT LITERATURE 5: JP-A-2006-176341

Non Patent Literature

NON PATENT LITERATURE 1: T. Sugiyama, et al., "Current status of EUVL mask blank development in AGC", 2006 International Symposium on Extreme Ultraviolet Lithography.
NON PATENT LITERATURE 2: SEMI Standard P40
NON PATENT LITERATURE 3: SEMI Standard P37
NON PATENT LITERATURE 4: J. Sohn, et al., "Flatness Compensation Updates/Challenges", IEUVI MASK TWG Meetings, Oct. 22, 2009.
NON PATENT LITERATURE 5: Ted. Liang, et al., "Strategy and Feasibility of Defect-free Mask Fabrication to enable EUVL", 2009 International Symposium on Extreme Ultraviolet Lithography.
NON PATENT LITERATURE 6: J. Sohn, et al., "Implementing E-beam correction Strategies for Compensation of EUVL Mask Non-flatness", 2009 International Symposium on Extreme Ultraviolet Lithography.

SUMMARY OF INVENTION

Technical Problem

The present invention aims to provide an optical member base material for EUVL, which has a small flatness for the film forming surface and back surface thereof and small total thickness distribution, and further has no concave defect such as a scratch, a streak, or a pit and no convex defect such as foreign substances attached to the surface thereof, having a relatively large size, and a method for producing the same.

Means for Solving the Problem

In order to attain the above object, the present invention is to provide
a method for producing an optical member base material for EUVL, comprising performing the following in this order to obtain an optical member base material for EUVL:
a preliminary-polishing step of preliminarily polishing a film forming surface and a back surface of the film forming surface of a glass substrate;
a measuring step of measuring a total thickness distribution and a flatness of the glass substrate; and
a corrective-polishing step of locally polishing only the back surface of the glass substrate depending on the measurement result of the measuring step.

In the method for producing an optical member base material for EUVL according to the present invention, it is preferred that the produced optical member base material for EUVL has flatness in a quality assurance area of the film forming surface and the back surface of 300 nm or less and the total thickness distribution of 45 nm or less.

The method for producing an optical member base material for EUVL according to the present invention may further comprising: a finishing-polishing step of finishing-polishing at least the surface that has been subjected to the local polishing, after the corrective-polishing step.

In the method for producing an optical member base material for EUVL according to the present invention, it is preferred that the finishing-polishing step is a step of conducting polishing so as to achieve a surface roughness (RMS) of the film forming surface being 0.15 nm or less and a surface roughness (RMS) of the back surface of the film forming surface being 0.5 nm or less in the quality assurance area of the glass substrate.

In the method for producing an optical member base material for EUVL according to the present invention, it is preferred that a change in the total thickness distribution and a change in the flatness of the optical member for EUVL to be shown in the finishing-polishing step are taken into consideration in the corrective-polishing step.

In the method for producing an optical member base material for EUVL according to the present invention, in the corrective-polishing step, use can be made of any one polishing method selected from a group consisting of mechanical polishing, ion beam etching, gas cluster ion beam etching, plasma etching, MRF (Magnetorheological Finishing), and nano-abrasion by laser beam irradiation.

Further, the present invention provides an optical member base material for EUVL, having, in a quality assurance area, a total thickness distribution of 45 nm or less, flatness of a film forming surface and a back surface of the film forming surface of 300 nm or less, and the number of defects having a size converted to a polystyrene latex particle diameter of 150 nm or larger being 10 or fewer in the film forming surface.

Further, the present invention provides a method for producing a multilayer reflective film-attached base material, comprising: a step of obtaining an optical member base material for EUVL by the above method for producing an optical member base material for EUVL; and a step of forming a multilayer reflective film that reflects EUV light, on a film forming surface of the optical member base material for EUVL.

Further, the present invention provides a method for producing a reflective mask blank for EUVL, comprising: a step of obtaining a multilayer reflective film-attached base material by the above method for producing a multilayer reflective film-attached base material; and a step of forming an absorber layer that absorbs EUV light, on the multilayer reflective film of the multilayer reflective film-attached base material.

Further, the present invention provides a method for producing a reflective photomask for EUVL, comprising: a step of obtaining a reflective mask blank by the above method for producing a reflective mask blank; and a step of forming an absorber pattern by patterning the absorber layer in the mask blank.

Advantageous Effect of the Invention

The present invention not only can reduce the number of defects having a relatively large size of a size converted to a polystyrene latex particle diameter of 150 nm or larger but also has an effect to reduce the number of defects having a size converted to a polystyrene latex particle diameter of 70 to 150 nm while maintaining total thickness distribution and flatness of a film forming surface and a back surface to a certain levels in quality assurance areas, and therefore, a high-quality optical member base material for EUVL can be produced easily with good productivity.

According to the present invention, therefore, an optical member base material for EUVL that achieves balance in terms of total thickness distribution, flatness of the film forming surface and the back surface, and the size of a defect such as a scratch, can be obtained. For this reason, it is possible to utilize a method for adjusting formation position of a mask pattern during drawing a mask pattern by using an electron beam, or the like. Therefore, even a substrate that does not meet the very strenuous demand levels of total thickness distribution being 100 nm or less and flatness of the film forming surface and the back surface being 100 nm or less can be used as an optical member base material for EUVL. In addition, since the method for producing an optical member base material for EUVL according to the present invention is simple method, it has excellent productivity, and contributes significantly to cost reduction.

BRIEF DESCRIPTION OF DRAWINGS

FIGS. 5(a) and 4(b) are side views showing an example of a glass substrate; FIG. 5(a) is a view of before performing corrective-polishing for a back surface; and FIG. 5(b) is a view of after performing corrective-polishing for the back surface.

FIGS. 6(a) and 6(b) are side views showing an example of a glass substrate; FIG. 6(a) is a view of before performing corrective-polishing for a back surface; and FIG. 6(b) is a view of after performing corrective-polishing for the back surface.

FIG. 7(a) is a view of before performing corrective-polishing for a back surface; FIG. 7(b) is a view of after performing corrective-polishing for the back surface; and FIG. 7(c) is a view of before and after performing finishing-polishing.

FIG. 8(a) is a view of before performing both surface-polishing by gas cluster ion beam etching; and FIG. 8(b) is a view of after performing both surface-polishing by gas cluster ion beam etching.

MODE FOR CARRYING OUT THE INVENTION

Hereinafter, an optical member base material for EUVL and a method for producing the same of the present invention will be described with reference to drawings.

In the present specification, an optical member base material for EUVL means a glass substrate which has been subjected to polishing processing the film forming surface and the back surface thereof so as to have a surface with very low roughness, being flat without gentle unevenness, and having no minute concave and convex defects.

The optical member base material for EUVL of the present invention has, in quality assurance areas, total thickness distribution of 45 nm or less, flatness of a film forming surface and a back surface of 300 nm or less, and at most 10 defects having a size converted to a polystyrene latex particle diameter of 150 nm or larger on the film forming surface.

Figure 1:
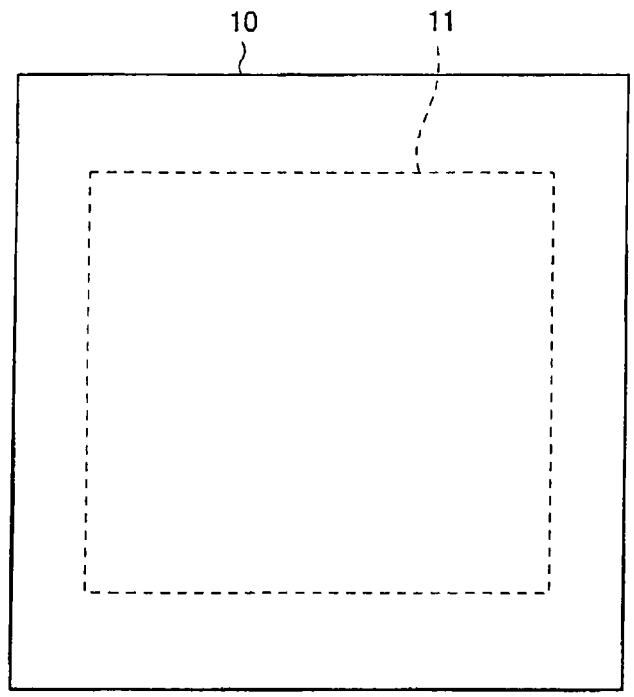
FIG. 1 is a plan view showing an example of an optical member base material for EUVL (glass substrate).

FIG. 1 is a plan view showing an example of an optical member base material for EUVL. The optical member base material for EUVL shown in FIG. 1 provides a base material for an EUVL optical member such as a mask blank or a mirror, and a film forming surface on which an ML film or an absorber layer is to be formed is illustrated.

The optical member base material for EUVL has quality assurance areas in the film forming surface and the back surface. The quality assurance area is an area on which EUV light is radiated for exposure and alignment, and an area on which EUV light or ultraviolet to visible light are radiated for alignment or mask identification, on the EUVL optical member produced by using the base material. When an EUVL optical member such as a mask blank or a mirror is produced by using the base material, an ML film or an absorber layer is formed on the quality assurance area in the film forming surface. On the other hand, on the quality assurance area in the back surface, a conductive layer for adsorption-holding the EUVL optical member by electrostatic chuck is generally formed.

In the case of an optical member base material for EUVL 10 shown in FIG. 1, 11 indicates a quality assurance area. The range of the quality assurance area differs depending on the dimensions of the optical member base material, more specifically, depending on the dimensions of the film forming surface and the back surface of the optical member base material. For example, when the dimensions of the film forming surface and the back surface is 152×152 mm square, the range of the quality assurance area is the area of 142 mm×142 mm square, excluding the outer edge portion of 5 mm from the end portion.

Therefore, when the optical member base material for EUVL is produced, the film forming surface and the back surface of a glass substrate is conventionally subjected to polishing processing so that quality assurance areas of the film forming surface and the back surface of the optical member base material for EUVL achieve certain degrees of surface roughness and flatness (P-V value).

As described above, however, even when the optical member base material for EUVL, which has been subjected to polishing processing so that the film forming surface and the back surface thereof, more specifically, the quality assurance areas in the film forming surface and the back surface have certain degrees of surface roughness and flatness (P-V value), is used, there may be a case where position accuracy of a formed pattern is problematic, such as occurrence of position deviation of the pattern on a produced reflective mask. This matter will be described with reference to FIG. 2.

Figure 2:
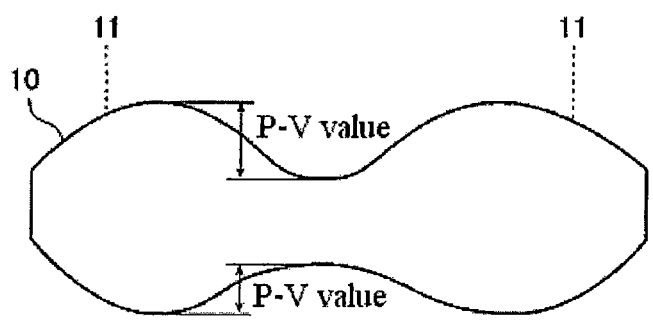
FIG. 2 is a side view showing an example of an optical member base material for EUVL (glass substrate).

FIG. 2 is a side view showing an example of an optical member base material for EUVL, and corresponds to a side view of the optical member base material for EUVL 10 illustrated in FIG. 1.

Incidentally, in order to help understanding, FIG. 2 emphatically shows unevenness in the side shape of the optical member base material for EUVL 10.

In FIG. 2, the upper side is the film forming surface and the lower side is the back surface. The film forming surface and the back surface respectively have gentle unevenness, and flatness of the film forming surface and flatness of the back surface defined by the unevennesses are each denoted by a P-V value.

As described above, when producing an optical member base material for EUVL, the film forming surface and the back surface of a glass substrate is conventionally subjected to polishing processing so that the film forming surface and the back surface, more specifically, quality assurance areas in the film forming surface and the back surface of the optical member base material for EUVL have certain degrees of surface roughness and flatness (P-V value).

When the optical member base material for EUVL is adsorption-held by electrostatic chuck, the back surface side is adsorption-held. If the optical member base material for EUVL 10 shown in FIG. 2 is adsorption-held, the optical member base material for EUVL 10 is deformed due to gentle unevenness present on the back surface. Then, flatness of the film forming surface denoted by P-V value deteriorates in comparison to that before the deformation, and thus, a certain degree of flatness is not satisfied.

The above-described problem in the conventional art, that is, deterioration of transfer accuracy during performing EUVL is considered to be caused by deformation of the optical member base material for EUVL during adsorption-holding as described above, and, deterioration in flatness of the film forming surface due to total thickness distribution of the optical member base material for EUVL to be described later.

Therefore, in order to suppress deterioration of transfer accuracy during performing EUVL, it is not sufficient that only each of the film forming surface and the back surface satisfies a predetermined flatness, but it is also necessary that the entire shape of the optical member base material for EUVL satisfies predetermined requirements.

Figure 3:
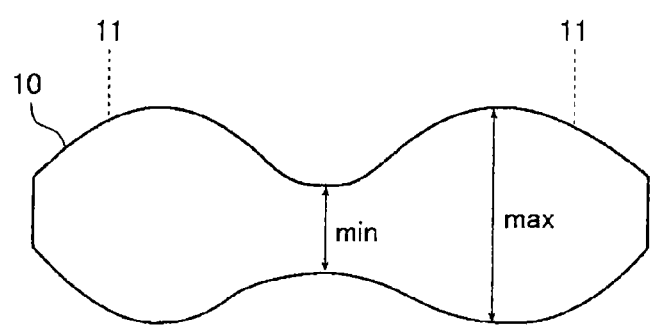
FIG. 3 is a side view showing an example of an optical member base material for EUVL (glass substrate).

As an index to evaluate the entire shape of the optical member base material for EUVL, the present invention utilizes total thickness distribution of the optical member base material for EUVL. Herein, the total thickness distribution means a difference between the maximum value (max) and the minimum value (min) in distribution of plate thickness of the optical member base material for EUVL excluding a tilting component, as shown in FIG. 3.

A method for measuring total thickness distribution of an optical member base material for EUVL includes a method in which, when the optical member base material for EUVL is made of a material with high light-transmitting property in the visible light region with a wavelength of 300 to 800 nm (e.g., silica glass or $TiO_2$—$SiO_2$ glass), plate thickness distribution of the optical member base material for EUVL is measured from an optical path difference of beams reflected from the film forming surface and the back surface by using an interferometer (e.g., Verifire or Mark IV made by Zygo, G310S made by Fujinon, or FlatMaster made by Tropel) having a light source of visible light with a wavelength of 300 to 800 nm, a tilting component is subtracted from the obtained plate thickness distribution, and the difference between the maximum value and the minimum value in the remainder is taken as total thickness distribution.

Alternatively, each surface shape (or surface profile) of the film forming surface and the back surface of the optical member base material for EUVL is measured by, for example, a laser interference type flatness measuring device (e.g., Verifire or MarkIV made by Zygo, G310S made by Fujinon, or FlatMaster made by Tropel), a laser displacement gauge, an ultrasonic displacement gauge, or a contact type displacement gauge, and plate thickness distribution of the optical member base material for EUVL can be computed by summing up the measurement results.

Figure 4:
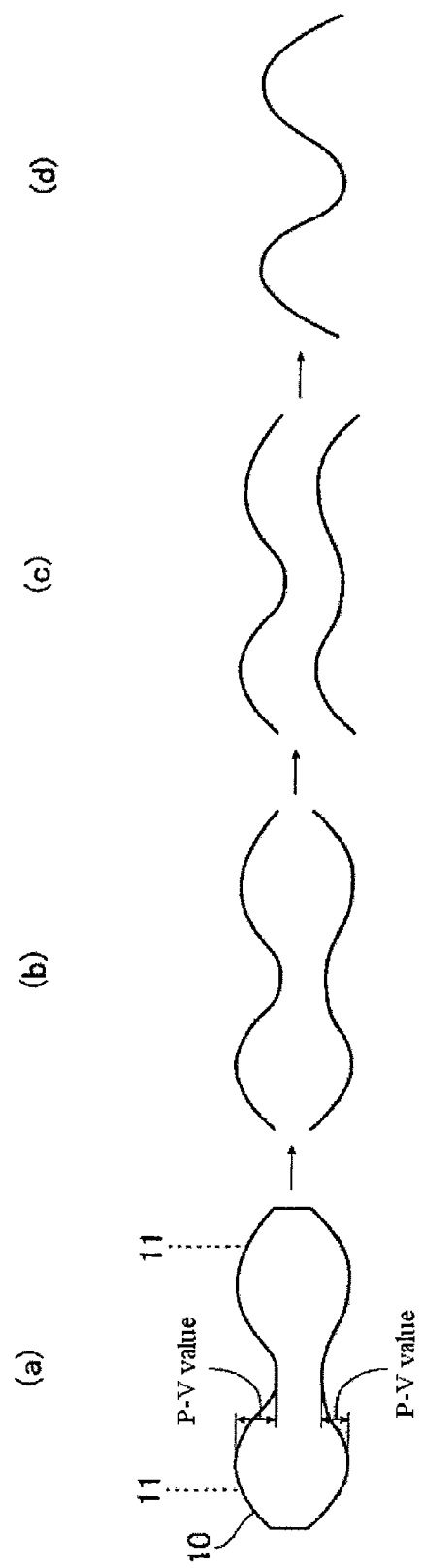
FIGS. 4(a) to 4(d) are illustrative diagrams of a computation procedure for thickness distribution of an optical member base material for EUVL (glass substrate).

Herein, in order to compute the plate thickness distribution of the optical member base material for EUVL, it is necessary that, among the surface shapes (or the surface profiles) of the film forming surface and the back surface, one surface shape measurement result is reversed and added to the other surface shape measurement result. For example, as shown in FIGS. 4(a) and 4(b), after the surface shapes (or the surface profiles) of the film forming surface and the back surface are measured, the measurement result of the surface shape (or the surface profile) of the back surface is reversed as shown in FIG. 4(c), and the measurement result of the surface shape (or the surface profile) of the film forming surface is added thereto, whereby plate thick distribution of the optical member base material for EUVL shown in FIG. 4(d) is computed. Total thickness distribution is obtained as the difference between the maximum value and the minimum value in the remainder obtained by subtracting a tilting component from the obtained plate thickness distribution. Since, in the former method, the obtained total thickness distribution includes refractive index distribution of the optical member base material for EUVL, in the case of an optical member base material for EUVL having refractive index distribution, the latter method is preferable.

The optical member base material for EUVL according to the present invention preferably has total thickness distribution in the quality assurance areas of 45 nm or less, more preferably 40 nm or less, and even more preferably 30 nm or less. In addition, the optical member base material for EUVL according to the present invention preferably has flatness (P-V values) in the quality assurance areas in the film forming surface and the back surface of 300 nm or less, more preferably 200 nm or less, and even more preferably 100 nm or less. Incidentally, flatness can be measured by the above-described laser interference type flatness measuring device, or the like.

Furthermore, the optical member base material for EUVL of the present invention preferably has at most 10 detects of which a size converted to a polystyrene latex particle diameter is 150 nm or larger, more preferably 5 or fewer, and even more preferably 0 in the quality assurance area in the film forming surface. In addition, it is preferred that the number of defects of which a size converted to a silica particle diameter is 70 nm or larger is at most 100, more preferably 80 or fewer, and even more preferably 60 or fewer in the quality assurance area in the film forming surface. Incidentally, the number of defects can be measured by automatic defect inspection machine M1320 or M1350 made by Lasertec Corporation, or the like.

Characteristics required for the optical member base material for EUVL of the present invention other than the foregoing ones are as follows.

The optical member base material for EUVL according to the present invention is required to be excellent in surface smoothness. Specifically, surface roughness of the film forming surface and the back surface in the quality assurance areas are measured by an atomic force microscope in 10 μm×10 μm square area, and the result (surface roughness RMS) in respect to the film forming surface is preferably 0.15 nm or less and that in respect to the back surface is preferably 0.5 nm, more preferably 0.3 nm, and even more preferably 0.15 nm.

The optical member base material for EUVL according to the present invention is required to have a small thermal expansion coefficient. Specifically, the thermal expansion coefficient is preferably 0±1.0×10$^{-7}$/° C., more preferably 0±0.3×10$^{-7}$/° C., even more preferably 0±0.2×10$^{-7}$/° C., even more preferably 0±0.1×10$^{-7}$/° C., and particularly preferably 0±0.05×10$^{-7}$/° C.

As a material having such a small thermal expansion coefficient, silica glass or $TiO_2$—$SiO_2$ glass can be exemplified. Among these, $TiO_2$—$SiO_2$ glass is preferable.

When $TiO_2$—$SiO_2$ glass is used, $TiO_2$ content is preferably 1 to 12 mass % since thermal expansion coefficient becomes far low, and more preferably 5 to 9 mass %.

It is preferable for the optical member base material for EUVL of the present invention to have excellent resistance against acidic or alkaline cleaning liquid that is generally used in cleaning a photomask after formation of a mask blank or pattern.

The size, thickness, or the like of the optical member base material for EUVL of the present invention is appropriately determined based on design values of the mask, or the like, and as an example thereof, the outer shape is 152 mm square and the thickness is 6.35 mm.

Next, a method for producing an optical member base material for EUVL according to the present invention will be described.

Preliminary-Polishing Step

In the method for producing an optical member base material for EUVL according to the present invention, first, a preliminary-polishing step of preliminarily polishing the film forming surface and the back surface of a glass substrate, which has been cut out from a matrix (ingot) in predetermined dimensions, so as to have desired flatness and surface roughness is performed.

Herein, the desired flatness is flatness obtained by adjusting flatness required for the optical member base material for EUVL by a change amount in flatness caused by implementation of a corrective-polishing step and a finishing-polishing step following the preliminary-polishing step. In other words, the computations are given as follows.

Desired flatness of film forming surface after preliminary-polishing=Flatness of film forming surface of optical member base material for EUVL−Change amount of flatness of film forming surface caused by finishing-polishing     Formula (1.1)

Desired flatness of back surface after preliminary-polishing= Flatness of back surface of optical member base material for $EUVL$− Change amount of flatness of back surface caused by finishing-polishing− Change amount of flatness of back surface caused by corrective-polishing     Formula (1.2)

In addition, the desired surface roughness is surface roughness obtained by adjusting surface roughness required for the optical member base material for EUVL by a change in surface roughness caused by implementation of a corrective-polishing step and a finishing step following a preliminary-polishing step, and the computations are given as follows.

Desired surface roughness of film forming surface after preliminary-polishing=Surface roughness of film forming surface of optical member base material for EUVL (0.15 nm or less)−Change amount of surface roughness of film forming surface caused by finishing-polishing     Formula (2.1)

Desired surface roughness of back surface after preliminary-polishing= Surface roughness of back surface of optical member base material for $EUVL$ (0.5 nm or less) − Change amount of surface roughness of back surface caused by finishing-polishing− Change amount of surface roughness of back surface caused by corrective − polishing     Formula (2.2)

Herein, in the case where the surface of the glass substrate after the preliminary-polishing step becomes the surface of the optical member base material for EUVL as is without performing the corrective-polishing step and the finishing-polishing step, change amounts of flatness and surface roughness in the corrective-polishing step and the finishing-polishing step in the above-described formulas (1.1), (1.2), (2.1) and (2.2) are zero, and thus, it is necessary to perform a preliminary-polishing step so as to attain flatness and surface roughness required as the optical member base material for EUVL.

Herein, the desired flatness of the film forming surface after preliminary-polishing and the desired surface roughness of the film forming surface after preliminary-polishing are described. In the case where the finishing-polishing for the film forming surface is not performed, a "change amount of flatness of film forming surface caused by finishing-polishing" in the above Formula (1.1) is zero, and a "change amount of surface roughness of film forming surface caused by finishing-polishing" in above Formula (2.1) is zero.

Next, the desired flatness of the back surface after preliminary-polishing and the desired surface roughness of the film forming surface after preliminary-polishing are described. In the case where the finishing-polishing for the back surface is not performed, a "change amount of flatness of back surface caused by finishing-polishing" in above Formula (1.2) is zero, and a "change amount of surface roughness of back surface caused by finishing-polishing" in above Formula (2.2) is zero. In addition, since the change amount of flatness of the back surface caused by corrective-polishing can be arbitrarily adjusted or controlled, it is possible to perform a corrective-polishing step with a change amount of flatness of the back surface caused by corrective-polishing given in Formula (1.2') as:

Change amount of flatness of back surface caused by corrective-polishing= Desired flatness of back surface after preliminary-polishing− (flatness of back surface of optical member base material for $EUVL$− change amount of flatness of back surface caused by finishing-polishing),     Formula (1.2′)

instead of performing the preliminary-polishing so as to obtain the desired flatness of the back surface given in Formula (1.2).

Polishing method used for the preliminary-polishing step is not particularly limited and can be widely selected from known polishing methods according to the material of a glass substrate. In the case where the material of a glass substrate is a silica glass-based material such as silica glass or $TiO_2$—$SiO_2$ glass, a mechanical polishing method or a chemical mechanical polishing method, in which a glass substrate is polished by using a double-sided lapping machine or a double-sided polishing machine while supplying polishing slurry containing abrasive and water to a polishing platen or a polishing pad, is generally used because these methods can achieve polishing processing for a large area at once by using such a polishing pad with a high processing rate and a large surface area.

For example, a method disclosed in JP-A-2009-12164 can be used. Specifically, as an abrasive in the polishing slurry, use can be made of particles formed of oxides such as a silicon oxide, an aluminum oxide, a zirconium oxide, a titanium oxide, or a cerium oxide, diamond, silicon carbide, or the like. In addition, as the polishing pad, use can be made of a suede-based pad having a layered structure formed by attaching a napping layer on a supporting base formed of unwoven cloth, a sheet-like resin, or the like, and as the material of the napping layer that contacts the glass substrate, use can be made of a resin foam of an ether base, ester base, carbonate base, or the like. It is preferable to sequentially polish the surface of a glass substrate with a double-sided lapping machine or a double-sided polishing machine while changing polishing conditions by using a plurality of abrasives with different particle diameters or materials and a plurality of polishing pads with different napping layer materials, foaming shapes and foaming sizes, to sequentially decrease surface roughness and flatness thereof, to thereby finally attain a glass substrate having the desired surface roughness and flatness. In addition, a polishing method other than the above-described mechanical polishing method and chemical mechanical polishing method can also be used for preliminary-polishing. Use can be made of a method involving beam irradiation or laser beam irradiation onto a surface to be polished, such as ion beam etching, gas cluster ion beam etching, plasma etching, or nano-abrasion by laser beam irradiation, to be used in corrective-polishing to be described later.

Measurement Step

Next, a measurement step of measuring total thickness distribution and flatness of a glass substrate after the preliminary-polishing step is performed in the above-described procedure. Surface roughness can also be measured in the above procedure, depending on necessity.

Corrective-Polishing Step

Next, a corrective-polishing step of locally polishing only the back surface of a glass substrate based on the measurement results of both total thickness distribution and flatness in the measurement step, and based on the measurement result of surface roughness of the measurement step depending on necessity is performed so as to obtain a glass substrate with the desired total thickness distribution, flatness, and surface roughness. In the present invention, the reason that the local polishing is performed only for the back surface is that if local polishing is performed for both film forming surface and back surface, there may arise a problem that the obtained glass substrate has a large total thickness distribution, intensified surface roughness, and a lot of defects on the film forming surface, while being excellent in flatness.

Herein, the desired total thickness distribution is total thickness distribution obtained by adjusting total thickness distribution required for the optical member base material for EUVL by a change amount in total thickness distribution caused by implementation of a finishing-polishing step following the corrective-polishing step. In other words, the computation is given as follows.

Desired total thickness distribution after corrective-polishing=Total thickness distribution (45 nm or less) of optical member base material for EUVL− Change amount of total thickness distribution caused by finishing-polishing    Formula (3)

The desired flatness is flatness obtained by adjusting flatness required for the optical member base material for EUVL by a change amount in flatness caused by implementation of a finishing-polishing step following the corrective-polishing step. In other words, the computation is given as follows.

Desired flatness of back surface after corrective-polishing=Flatness (300 nm or less) of back surface of optical member base material for EUVL− Change amount of flatness of back surface caused by finishing-polishing    Formula (4)

In addition, the desired surface roughness is surface roughness obtained by adjusting surface roughness required for the optical member base material for EUVL by a change in surface roughness caused by implementation of a finishing-polishing step following the corrective-polishing step, and the computation is given as follows.

Desired surface roughness of back surface after corrective-polishing=Surface roughness (0.5 nm or less) of optical member base material for EUVL− Change amount of surface roughness of back surface caused by finishing-polishing    Formula (5)

Herein, the desired total thickness distribution after corrective-polishing is described. In the case where at least finishing-polishing for the back surface is not performed, the "change amount of total thickness distribution caused by finishing-polishing" in the above-described Formula (3) is zero.

The desired flatness of the back surface after corrective-polishing and the desired surface roughness of the back surface after corrective-polishing are described. In the case where the finishing-polishing is not performed, the "change amount of flatness of back surface caused by finishing-polishing" in above Formula (4) is zero, and the "change amount of surface roughness of back surface caused by finishing-polishing" in above Formula (5) is zero. In addition, these three items of flatness of the film forming surface, and flatness of the back surface, and total thickness distribution are not all independently determined, and if two items out of three are determined, the remaining one item is obtained uniquely. For example, flatness of the back surface is obtained uniquely based on flatness of the film forming surface and total thickness distribution. For this reason, flatness of the film forming surface and total thickness distribution may be preferentially considered so that flatness of the back surface can satisfy the flatness (300 nm or less) required for the optical member base material for EUVL. Specifically, the preliminary-polishing step, corrective-polishing step, and finishing-polishing step can also be performed in consideration of change in flatness and change in total thickness distribution in the corrective-polishing step and finishing-polishing step in accordance only with Formulas (1.1) and (3) so that flatness of the film forming surface is 300 nm or less, total thickness distribution is 45 nm or less, and flatness of the back surface computed from the flatness of the film forming surface and the plate thickness distribution is 300 nm or less.

As a specific example, the procedure in which the back surface of a glass substrate is subjected to corrective-polishing based on the measurement result of total thickness distribution in the measurement step so as to attain total thickness distribution of the glass substrate after the corrective-polishing step to be approximately 0 nm will be described with reference to FIG. 5(a) and FIG. 5(b). FIG. 5(a) and FIG. 5(b) are side views showing an example of a glass substrate, the dashed line in FIG. 5(b) corresponds to a side view of the glass substrate before the back surface is subjected to corrective-polishing, and the solid line in FIG. 5(b) corresponds to a side view of the glass substrate after the back surface is subjected to corrective-polishing. As shown in FIG. 5(a) and FIG. 5(b), the back surface of the glass substrate is subjected to corrective-polishing so that total thickness distribution of the glass substrate becomes approximately 0 nm by setting a local polishing amount for each portion of the back surface based on the measurement result of total thickness distribution in the measurement step in a such a way that a portion with a high plate thickness is set to a large polishing amount and a portion with a low plate thickness is set to a small polishing amount. In addition, in the case of performing finishing-polishing, since total thickness distribution changes depending on the finishing-polishing, it may be only necessary that total thickness distribution to the extent of offsetting the change amount can be obtained after the corrective-polishing step.

The surface that is subjected to the corrective-polishing step herein is the back surface. There are at least two more reasons in addition to the above-described reason, which are described below.

Reason (1): Demands on surface roughness (RMS) for the film forming surface and the back surface of an optical member base material for EUVL are at least, 0.15 nm or less and 0.5 nm or less, respectively. The demand on surface roughness for the film forming surface is stricter than that for the back surface, but each of the values is at the level that can be easily realized by preliminary-polishing or finishing-polishing to be described later. However, there may be a case where surface roughness increases by local polishing, and surface roughness after corrective-polishing step can satisfy the demand on the back surface, but there may be a case where the demand on the film forming surface is not necessarily satisfied.

Reason (2): Demand concerning defects on the film forming surface of an optical member base material for EUVL is that at least the number of defects in the size of 150 nm or larger is 0 or fewer. In addition, demand concerning defects on the back surface is that at least the number of defects in the size of 1000 nm or larger is 0 or fewer, which is not strict in comparison to that for the film forming surface. There may be a case where convex defects such as particles attach to the surface due to local polishing. All convex defects attached are not always removed by cleaning after corrective-polishing step. In addition, stress is applied to the surface of a glass substrate by performing local polishing, and therefore, in the case of performing finishing-polishing to be described later, concave defects such as scratches, streaks or pits in a small size particularly of 150 nm or less easily occur.

A local polishing method used in corrective-polishing is not particularly limited as long as it is a polishing method in which a polishing amount can be arbitrarily set for each portion on the film forming surface of the glass substrate to be polished. Therefore, it may be a mechanical polishing that can set a polishing amount for each portion on the surface to be polished. Specific examples of such mechanical polishing include mechanical polishing using a polishing pad with a small diameter, for example, a polishing pad with the diameter of about 2 cm, and mechanical polishing as disclosed in JPA-2004-29735, in which a polishing pressing force changes by portion. In addition, it may be a polishing using magnetic abrasive grains, in other words, MRF (Magnetorheological finishing) as disclosed in International Publication WO2002/060646. Furthermore, use can be also made of polishing methods involving beam irradiation or layer beam irradiation onto a surface to be polished, such as ion beam etching, gas cluster ion beam etching, plasma etching, and nano-abrasion by laser beam irradiation. Such polishing methods involving beam irradiation or layer beam irradiation onto a surface to be polished is preferable in that they have high processing accuracy, and are allowed to have a small polishing amount in finishing-polishing since surface defects rarely occur.

Incidentally, in the case where the above-described polishing methods involving beam irradiation or layer beam irradiation onto a surface to be polished are used in corrective-polishing for the back surface of a glass substrate, a diameter of beam or layer beam to be used is preferably 15 mm or less in terms of an FWHM (Full Width of Half Maximum) value in light of improving processing accuracy, and more preferably 10 mm or less. Herein, when the diameter of beam or laser beam is set within the above-described range, it is necessary for the back surface of a glass substrate that is the surface to be polished to be scanned with beams or laser beams. As a technique of scanning with beams or laser beams, use can be made of a known method such as raster scanning or spiral scanning.

Among the above-described methods involving beam irradiation or layer beam irradiation onto a surface to be polished, gas cluster ion beam etching is particularly preferable for the reason that it can process a surface to have low surface roughness and to be excellent in smoothness, has high processing accuracy, and is allowed to have a small polishing amount in finishing-polishing since surface defects rarely occur.

Gas cluster ion beam etching is a method in which a reactive material (source gas), which is in a gaseous state under normal temperature and pressure, is sprayed through an expansive nozzle in a vacuum device in a pressurized state to form a gas cluster, followed by electronic irradiation, and the ionized gas cluster ion beams are irradiated on a target object to perform etching. A gas cluster is composed of massive atomic or molecular assembly generally containing thousands of atoms or molecules. In the case where gas cluster ion beam etching is used for corrective-polishing for the back surface of a glass substrate, when gas clusters collide with a surface to be polished, a multi-body impact effect generates due to interaction with a solid object, whereby the surface to be polished is polished.

In the case where gas cluster ion beam etching is used, as a source gas, gas such as $SF_6$, Ar, $O_2$, $N_2$, $NF_3$, $N_2O$, $CHF_3$, $CF_4$, $C_2F_6$, $C_3F_8$, $C_4F_6$, $SiF_4$, or $COF_2$ can be used in single or by being mixed. Among these, $SF_6$ and $NF_3$ are excellent as a source gas in terms of chemical reaction occurring at the time of colliding with the surface to be polished. Therefore, a mixed gas containing $SF_6$ or $NF_3$, specifically, a mixed gas of $SF_6$ and $O_2$, a mixed gas of $SF_6$, Ar, and $O_2$, a mixed gas of $NF_3$ and $O_2$, a mixed gas of $NF_3$, Ar, and $O_2$, a mixed gas of $NF_3$ and $N_2$, and a mixed gas of $NF_3$, Ar, and $N_2$ are preferable. For these mixed gases, appropriate mixing ratios of each component differ depending on the condition of irradiation or the like, but preferable ratios are as follows.

$SF_6:O_2$=0.1 to 15%:85 to 99.9% (mixed gas of $SF_6$ and $O_2$), $SF_6:Ar:O_2$=0.1 to 15%:9.9 to 49.9%:50 to 90% (mixed gas of $SF_6$, Ar, and $O_2$), $NF_3: O_2$=0.1 to 15%:85 to 99.9% (mixed gas of $NF_3$ and $O_2$), $NF_3:Ar:O_2$=0.1 to 15%:9.9 to 49.9%:50 to 90% (mixed gas of $NF_3$, Ar, and $O_2$), $NF_3:N_2$=0.1 to 15%:85 to 99.9% (mixed gas of $NF_3$ and $N_2$), $NF_3:Ar:N_2$=0.1 to 15%:9.9 to 49.9%:50 to 90% (mixed gas of $NF_3$, Ar, and $N_2$)

Furthermore, irradiation conditions including a cluster size, an ionizing current applied to an ionizing electrode of a gas cluster ion beam etching device for ionizing clusters, an accelerating voltage applied to an accelerating electrode of the gas cluster ion beam etching device, and a dose amount of gas cluster ion beams, can be appropriately selected according to the surface state of a glass substrate or the type of the source gas. For example, in order to correctively polish the back surface of a glass substrate without excessively deteriorating surface roughness thereof, an accelerating voltage applied to the accelerating electrode is preferably 15 to 50 kV.

After the corrective-polishing for the back surface of a glass substrate, total thickness distribution of the glass substrate, and flatness of at least the surface that has been subjected to corrective-polishing are measured in the same procedure as that of the above-described measurement step. In addition, surface roughness of at least the surface that has been subjected to corrective-polishing is measured, if necessary. As a result of measurement, if each of total thickness distribution of the glass substrate, flatness of the film forming surface and the back surface (P-V value), surface roughness of the film forming surface, and surface roughness of the back surface satisfies 45 nm or less, 300 nm or less, 0.15 nm or less, and 0.5 nm or less, respectively, the glass substrate of which the back surface has been subjected to corrective-polishing can be preferably used as an optical member base material for EUVL of the present invention.

On the other hand, if total thickness distribution obtained from the measurement result of plate thickness distribution exceeds 45 nm, or if flatness of the back surface that has been subjected to corrective-polishing exceeds 300 nm, corrective-polishing is performed again for the back surface based on the measurement result of the plate thickness distribution and flatness. However, if each of total thickness distribution of the glass substrate, flatness of the film forming surface and the back surface, surface roughness of the film forming surface, and surface roughness of the back surface can be 45 nm or less, 300 nm or less, 0.15 nm or less, and 0.5 nm or less, respectively, by finishing-polishing, the finishing-polishing may be performed in the procedure to be described below, without performing corrective-polishing again.

The above-described processing method involving beam irradiation or layer beam irradiation onto a surface to be polished is a proper processing method for corrective-polishing for the back surface of a glass substrate in that it has high processing accuracy, and is allowed to have a small polishing amount in finishing-polishing since surface defects rarely occur. However, there may be a case where surface roughness of the surface to be polished a little deteriorates depending on surface state of the surface to be polished or irradiation conditions of beams or laser beams.

In addition, in the above-described processing method involving beam irradiation or laser beam irradiation onto a surface to be polished, there may be a case where attachment of convex defects such as particles to the surface occurs.

Finishing-Polishing Step

In the method for producing an optical member base material for EUVL according to the present invention, in order to improve surface roughness of the surface to be polished and/or to remove convex defects such as particles attaching to the surface, finishing-polishing may be performed for at least the surface that has been subjected to corrective-polishing, after corrective-polishing is performed for the back surface of the glass substrate.

In order to lower scattering loss during EUV light reflection or to give no adverse influence to defect inspection, the film forming surface and the back surface after finishing-polishing preferably have surface roughness (RMS) in the quality assurance areas of 0.15 nm or less and 0.5 nm or less, respectively, more preferably 0.12 nm or less and 0.3 nm or less, respectively, and even more preferably 0.10 nm or less and 0.2 nm or less, respectively. For this, it is preferable to perform finishing-polishing step so as to obtain surface roughness as above.

In order to accurately and satisfactorily transfer a mask pattern on a reflective photomask onto a resist film on a wafer during EUVL implementation without a pattern flaw, the total number of defects including concave defects and convex defects in the quality assurance area in the film forming surface and the back surface after finishing-polishing is preferably 0 for defects with a size of 150 nm or larger and preferably at most 100 for defects with a size of 70 nm or larger.

The surface thickness of a glass substrate to be removed by polishing in the finishing-polishing step (finishing-polishing amount) is preferably at least 0.005 μm or thicker, or preferably 0.01 μm or thicker, in order to realize the above-described surface roughness of 0.3 nm or less. On the other hand, whereas the finishing-polishing step is advantageous in that it reduces surface roughness and the number of defects on a glass substrate, there is a possibility that the total thickness distribution of the glass substrate and flatness of the surface to be subjected to finishing-polishing may change, due to distribution of finishing-polishing speed within the glass substrate surface. The change amount increases as the finishing-polishing amount becomes greater. For this reason, it is preferable for the polishing amount of finishing-polishing to be as small as possible, and specifically, 1.0 μm or less is preferable, and 0.7 μm or less is particularly preferable.

In addition, when finishing-polishing is performed, even in the case where the finishing-polishing amount is set to the minimum, total thickness distribution and flatness change due to finishing-polishing. Therefore, as described above, in order to acquire total thickness distribution and flatness, which are obtained by adjusting the total thickness distribution and flatness required for an optical member base material for EUVL with changes in total thickness distribution and flatness during finishing-polishing, after corrective-polishing step that is a pre-step of the finishing-polishing step, it is preferable to perform preliminary-polishing step and corrective-polishing step.

Herein, the reason that distribution of finishing-polishing speed within a glass substrate surface occurs includes distribution of polishing pressure within the glass substrate surface, distribution of composition of the glass substrate material, distribution of stress of the glass substrate caused by the composition distribution, or the like. A change amount of total thickness distribution and a change amount of flatness in the finishing-polishing step can be obtained in such a way that a glass substrate, which has the same composition and size as that of the optical member base material for EUVL of the present invention and has been subjected to the preliminary-polishing and the corrective-polishing steps of the present invention, is separately prepared, and total thickness distribution thereof, flatness of the film forming surface and the back surface, and surface roughness of the film forming surface and the back surface are measured before and after the same finishing-polishing step as that of the present invention is performed. Alternatively, in the case where the glass substrate is composed of $TiO_2$—$SiO_2$ glass, and changes in total thickness distribution and flatness in finishing-polishing step are caused by glass composition distribution, in other words, distribution of $TiO_2$ concentration in the glass substrate, it may be also possible to use a calculation value of change amounts in total thickness distribution and flatness in the finishing-polishing step that can be calculated from both results of a result of glass substrate composition dependency of a finishing-polishing speed and a measurement result, obtained by fluorescent X-ray analysis, of composition distribution of the glass substrate to be finally polished, or the like.

As a processing method to be used in finishing-polishing, use can be made of chemical mechanical polishing which is called touch polishing and uses polishing slurry under low surface pressure, for example, surface pressure of 1 to 500 $cN/cm^2$. In the touch polishing, a method disclosed in, for example, JP-A-2009-12164 can be utilized, and the film forming surface and the back surface can be processed with polishing under predetermined surface pressure of, for example, surface pressure of 1 to 500 $cN/cm^2$ or preferably surface pressure of 1 to 300 $cN/cm^2$ in such a way that an optical member base material for EUVL is set between grinders on which a polishing pad such as unwoven cloth or abrasive cloth is placed, the grinders are rotated relatively to the optical member base material for EUVL while supplying polishing slurry adjusted to a predetermined state. Surface pressure during touch polishing, however, is not limited thereto.

As a polishing pad, an elastic body such as foamed polyurethane or foamed polyvinyl is preferable, and, for example, Bellatrix N7512 made by Kanebo, Ltd. or the like, can be used. As polishing slurry, use can be made of silicon oxide, aluminum oxide, cerium oxide, or the like. As silicon oxide, fumed silica or colloidal silica can be used, and colloidal silica is preferable in that highly-pure fine particles with a uniform particle diameter are easily obtained.

Hereinbelow, an abrasive will be described in detail having colloidal silica as an example. Other abrasives are substantially the same as this.

The average primary particle diameter of colloidal silica is preferably 80 nm or less, more preferably less than 50 nm, and particularly preferably less than 25 nm. The lower limit of the average primary particle diameter of colloidal silica is not limited, but is preferably 5 nm or greater, and more preferably 10 nm or greater in term of enhancement of polishing efficiency. If the average primary particle diameter of colloidal silica exceeds 80 nm, there may be a case where it is difficult to process the film forming surface and the back surface to be polished, to desired surface roughness. In addition, it is desirable for colloidal silica not to contain secondary particles generated from agglomeration of primary particles as possible as it can, in terms of controlling the particle diameter sensitively. Even when secondary particles are contained, the average particle diameter thereof is preferably 80 nm or less. Incidentally, the particle diameter of colloidal silica mentioned herein is obtained by measuring an image magnified to $10\times10^3$ to $200\times10^3$ using an SEM (scanning electron microscope). It is preferable to measure an image magnified to $15\times10^3$ to $105\times10^3$.

The content of colloidal silica in polishing slurry is preferably 10 to 30 mass %. If the content of colloidal silica in polishing slurry is within the above-described range, polishing efficiency improves, which is economically advantageous, and colloidal silica will be used in a reasonable amount, which is desirable in terms of cost and cleaning efficiency. It is more preferably 18 to 25 mass %, and particularly preferably 18 to 22 mass %. Polishing slurry is preferably adjusted to an acid region of pH=0.5 to 3, or to an alkaline region of pH=7 to 10. In a weak acid region to a neutral region of pH=3 to 7, it is difficult to stably disperse colloidal silica in a solution.

As water used in polishing slurry, pure water or ultra pure water from which foreign substances are eliminated is preferably used. In other words, pure water or ultra pure water in which fine particles with the maximum diameter measured in light scattering method using laser light or the like, of 0.1 μm or greater are substantially included by at most 100 particles/ ml is preferable. If more than 100 particles/ml of foreign substance are incorporated, regardless of the material and shape thereof, there is concern that surface defects such as scratches or pits generates on the film forming surface and the back surface to be polished. Foreign substances in pure water or ultra pure water can be removed by, for example, filtration by a membrane filter or ultrafiltration, but a method for removing foreign substances is not limited thereto.

As finishing-polishing aiming only at improvement of surface roughness, gas cluster ion beam etching can be used. In this case, gas cluster ion beam etching is performed by changing irradiation conditions of a source gas, ionizing current, and acceleration voltage from those of gas cluster ion beam etching previously performed. Specifically, by using lower ionizing current or lower accelerating voltage, gas cluster ion beam etching is performed under further moderate conditions. More specifically, an accelerating voltage is preferably 3 kV or higher and lower than 30 kV, more preferably 3 to 20 kV. In addition, as a source gas, it is preferable to use a single $O_2$ gas, or a mixed gas of $O_2$ and at least one gas selected from a group consisting of Ar, CO, and $CO_2$, from the point that it rarely causes a chemical reaction at the time of colliding with the surface to be polished. Among these, it is preferable to use a mixed gas of $O_2$ and Ar.

EXAMPLES

Hereinafter, the present invention will be described in further detail with reference to examples. The present invention, however, is not limited thereto.

Example 1

In the present example, an optical member base material for EUVL was made using a $TiO_2$—$SiO_2$ glass substrate.

Preliminary-Polishing Step

The ingot of $TiO_2$—$SiO_2$ glass (the $TiO_2$ doping amount is 7 mass %) produced in a known method was cut into a plate shape of 153 mm square×thickness of 6.75 mm with an inner blade slicer. It was subjected to chamfering processing with a diamond grindstone of #120 using an NC chamfering machine so that a chamfering width is 0.2 to 0.4 mm, to prepare a $TiO_2$—$SiO_2$ glass substrate with an outer dimensions of 152 mm square and a thickness of 6.75 mm. The $TiO_2$—$SiO_2$ glass substrate was interposed in platens made of cast iron, and the surfaces thereof were subjected to lapping-polishing while supplying abrasive grains containing $Al_2O_3$ as the main component. End surface polishing was performed for the end surfaces of the substrate using a nylon brush and cerium oxide slurry. After that, the film forming surface and the back surface of the glass substrate were sequentially subjected to, using a double-side polishing machine, first-stage polishing using a hard foamed polyurethane pad and cerium oxide slurry, second-state polishing using a soft foamed polyurethane suede pad and cerium oxide slurry, and third-stage polishing using a soft foamed polyurethane suede pad and colloidal silica, so that flatness of the film forming surface of the $TiO_2$—$SiO_2$ glass substrate becomes 100 nm or less and surface roughness (RMS) of the film forming surface becomes 0.15 nm or less.

Subsequently, the $TiO_2$—$SiO_2$ glass substrate was subjected to scrub cleaning using a PVA sponge, immersion using a batch-type cleaning device, in various solutions of a mixed solution of sulfuric acid and hydrogen peroxide solution, alkaline detergent, and ultra pure water in this order in a state of being applied with ultrasonic, and immersion in isopropyl alcohol (IPA), and then was dried at 80° C.

Measurement Step

Flatness in the quality assurance areas (142 mm square in the center) in the film forming surface and the back surface of the TiO$_2$—SiO$_2$ glass substrate after the preliminary-polishing step were measured using a Fizeau laser interference type flatness measuring device (G310S made by Fujinon), as a result, flatness of the film forming surface was 97 nm, which was a level that satisfies the flatness required as an optical member base material for EUVL, but flatness of the back surface was large as 550 nm, which did not satisfy the flatness required as an optical member base material for EUVL. Among the measurement results of the obtained surface profiles, the measurement result of the surface profile of the film forming surface was reversed and added to the measurement result of the surface profile of the back surface, to compute plate thickness distribution of the substrate. The total thickness distribution was 512 nm, which failed to satisfy the total thickness distribution required as an optical member base material for EUVL.

On the other hand, surface roughness (RMS) of the film forming surface and the back surface of the glass substrate after the preliminary-polishing step were measured with an atomic force microscope (SPA460 made by Seiko Instruments), as a result, the value for both was 0.1 nm, which satisfies the surface roughness required as an optical member base material for EUVL.

Corrective-Polishing Step

Subsequently, a corrective-polishing step was performed by implementing local polishing for the back surface of the TiO$_2$—SiO$_2$ glass substrate. In local polishing here, raster scanning of gas cluster ion beams was conducted under processing conditions as shown below, by using gas cluster ion beam etching (US50XP made by Epion). Herein, a local polishing amount for each portion was set to a value computed based on the plate thickness distribution and flatness obtained in the measurement step so that total thickness distribution after corrective-polishing step is 45 nm or less, flatness of the back surface is 300 nm or less, surface roughness (RMS) of the back surface is 0.5 nm or less, and a local polishing amount have the minimum value, and it was controlled to obtain the desired local polishing amount by adjusting the scanning speed of the gas cluster ion beams.

(Processing Conditions)

Source gas: Mixed gas consisting of 5% of NF$_3$ and 95% of N$_2$

Accelerating voltage: 30 kV

Ionizing current: 100 μA

Beam diameter of gas cluster ion beam (FWHM value): 6 mm

Etching speed: 50 nm·cm$^2$/sec

After local polishing is completed, the TiO$_2$—SiO$_2$ glass substrate was cleaned in the same manner as that performed after the preliminary-polishing step, and then, total thickness distribution of the obtained TiO$_2$—SiO$_2$ glass substrate (optical member base material for EUVL), flatness of both surfaces, and surface roughness of both surfaces were measured in the same manner as the measurement step described above. The total thickness distribution was 30 nm, the flatness of the film forming surface was 97 nm, the flatness of the back surface was 98 nm, the surface roughness (RMS) of the film forming surface was 0.1 nm, and the surface roughness (RMS) of the back surface was 0.4 nm, all of which satisfied the qualities required as an optical member base material for EUVL.

Then, defect inspection for the film forming surface of the optical member base material for EUVL was performed using automatic defect inspection machine M1320 made by Lasertec Corporation, as a result, the number of defects having a size converted to polystyrene latex particle of 150 nm or larger was 0. In order to evaluate the number of defects in a smaller size, the optical member base material for EUVL was subjected to wet cleaning in a single wafer processing cleaning machine by using various solutions described above, a multilayer reflective film (a film obtained by stacking: a reflective film obtained by alternately stacking Si films in a thickness of about 4 nm and Mo films in a thickness of about 4 nm in this order to 50 layers; and an Ru film in a thickness of about 2.5 nm in this order) was formed on the film forming surface of the optical member base material for EUVL using an ion beam sputtering method, and then defect inspection for the film forming surface of the optical member base material for EUVL is performed using automatic defect inspection machine M1350 made by Lasertec Corporation. In this case, the number of concave and convex defects of a size converted to silica particles of 70 nm or greater could be evaluated, and the number of concave defects of a size converted to silica particles of 70 nm or greater was 28, and the number of convex defects thereof was 44.

Images of changes in the shape of the TiO$_2$—SiO$_2$ glass substrate caused by corrective-polishing on the back surface are shown in FIGS. 6(a) and 6(b). The dashed line of FIG. 6(b) corresponds to a side view of the glass substrate before corrective-polishing for the back surface, and the solid line of FIG. 6(b) corresponds to a side view of the glass substrate (optical member base material for EUVL) after corrective-polishing for the back surface.

Example 2

Finishing-polishing was performed for both surfaces of the film forming surface and the back surface under finishing-polishing conditions shown in Example 2 below using a piece of TiO$_2$—SiO$_2$ glass substrate obtained in the same manner as that of Example 1, and a change amount of plate thickness distribution (20 nm), a change amount of flatness of the film forming surface and the back surface (23 nm), a change amount of surface roughness of the film forming surface (substantially no change), a change amount of surface roughness of the back surface (−0.3 nm) of the corresponding TiO$_2$—SiO$_2$ glass substrate in the finishing-polishing were obtained in advance (the values in the parenthesis indicates change amounts obtained).

Preliminary-Polishing Step

Preliminary-polishing step was performed in the same manner as that in Example 1 except that the change amount of flatness, the change amount of plate thickness distribution and the change amount of surface roughness by the finishing-polishing were taken into consideration so that flatness (300 nm or less for both film forming surface and back surface) and total thickness distribution (45 nm or less) required as an optical member base material for EUVL could be attain after corrective-polishing step and finishing-polishing step, to thereby prepare a piece of TiO$_2$—SiO$_2$ glass substrate.

Measurement Step

For the TiO$_2$—SiO$_2$ glass substrate after the preliminary-polishing step, total thickness distribution, flatness of both surfaces and surface roughness of both surfaces were measured in the same manner as that in Example 1, as a result, total thickness distribution was 552 nm, flatness of the film forming surface was 123 nm, flatness of the back surface was 622 nm, surface roughness (RMS) of the film forming surface was 0.1 nm, and surface roughness (RMS) of the back surface was 0.1 nm.

Corrective-Polishing Step

Next, a corrective-polishing step was performed in the same manner as that in Example 1 except that local polishing amounts of each portion were not only calculated based on the plate thickness distribution obtained in the measurement step so that total thickness distribution is 45 nm or less, flatness of the back surface is 300 nm or less, and surface roughness (RMS) of the back surface is 0.5 nm after the corrective-polishing step and the local polishing amounts have the minimum values, but also calculated in consideration of the change amount of total thickness distribution and the change amount of flatness in the finishing-polishing. After local polishing was completed, the $TiO_2$—$SiO_2$ glass substrate was cleaned in the same manner as that in Example 1.

Finishing-Polishing Step

The film forming surface and the back surface of the glass substrate were subjected to finishing-polishing under the conditions shown below, and the glass substrate was cleaned with the same conditions as those in Example 1.

<Finishing-Polishing Conditions>

Polishing test machine: Double-sided 24B polishing machine made by HAMAI CO., LTD.

Polishing pad: Bellatrix N7512 made by Kanebo, Ltd.

Polishing platen rotation speed: 10 rpm

Polishing time: 30 minutes

Polishing load: 51 $cN/cm^2$

Polishing amount: 0.06 μm/surface

Dilution water: Pure water (foreign substances of 0.1 μm or larger are filtered)

Slurry flow rate: 10 liter/min.

Polishing slurry: Containing 20 mass % of colloidal silica of which the average primary particle diameter is less than 20 nm Polishing amount: 0.02 μm Total thickness distribution, flatness of both surfaces and surface roughness of both surfaces of the obtained optical member base material for EUVL were measured in the same manner as that in the measurement step, as a result, total thickness distribution was 42 nm, flatness of the film forming surface was 97 nm, flatness of the back surface was 94 nm, surface roughness (RMS) of the film forming surface was 0.1 nm, and surface roughness (RMS) of the back surface was 0.1 nm, all of which satisfied the qualities required as an optical member base material for EUVL. Then, defect inspection for the film forming surface of the optical member base material for EUVL was performed using automatic defect inspection machine M1320 made by Lasertec Corporation, as a result, the number of defects in a size of 150 nm or larger was 0. Since the number of defects in a size of 150 nm or larger was 0, the number of defects in a size of 70 nm or larger was evaluated in the same manner as that in Example 1, as a result, the number of concave defects in a size of 70 nm or larger was 25, and the number of convex defects thereof was 20.

Figure 7:
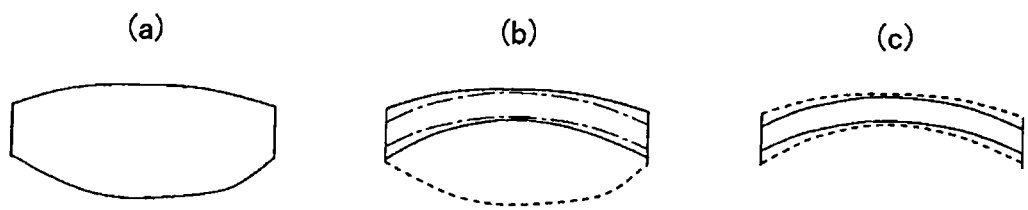
FIGS. 7(a) to 7(c) are side views showing an example of a glass substrate.

Images of changes in the shape of the $TiO_2$—$SiO_2$ glass substrate caused by corrective-polishing on the back surface and finishing-polishing on the film forming surface and the back surface are shown in FIGS. 7(a) to 7(c). The dashed line of FIG. 7(b) corresponds to a side view of the glass substrate before corrective-polishing for the back surface, and the solid line of FIG. 7(b) and the dashed line of FIG. 7(c) correspond to a side view of the glass substrate after the corrective-polishing for the back surface. In addition, the solid line of FIG. 7(c) corresponds to a side view of the glass substrate (optical member base material for EUVL) after finishing-polishing for the film forming surface and the back surface.

Furthermore, FIG. 7(b) shows change amounts of plate thickness distribution and flatness caused by the finishing-polishing by the dashed-dotted line.

Comparative Example 1

Preliminary-polishing step, measurement step, and corrective-polishing step were performed under the same conditions as those in Example 1, except that the corrective-polishing step was performed not only for the back surface of a $TiO_2$—$SiO_2$ glass substrate but also for both of the back surface and the film forming surface.

Total thickness distribution, flatness of both surfaces, and surface roughness of both surfaces of the obtained optical member base material for EUVL were measured in the same manner as that in Example 1, as a result, total thickness distribution was 28 nm, flatness of the film forming surface was 34 nm, flatness of the back surface was 35 nm, surface roughness (RMS) of the film forming surface was 0.4 nm, and surface roughness (RMS) of the back surface was 0.4 nm, which indicate that total thickness distribution and flatness were very superior, but the surface roughness was inferior. Then, defect inspection for the film forming surface of the optical member base material for EUVL was performed using automatic defect inspection machine M1320 made by Lasertec Corporation, as a result, the number of defects in a size of 150 nm or larger was 10,000. These defects are defects which attached in local polishing in the corrective-polishing step, and because these defects could not be removed in cleaning after the local polishing, they are left on the surface.

Figure 8:
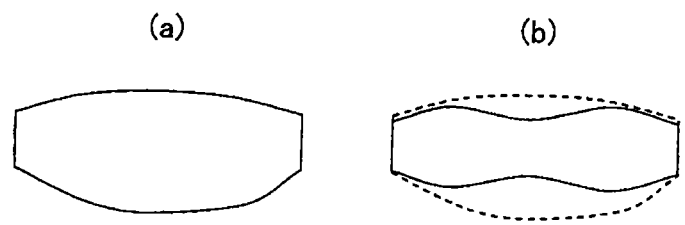
FIGS. 8(a) and 8(b) are side views showing an example of a glass substrate.

Images of changes in the shape of the glass substrate caused by polishing with gas cluster ion beam etching for the film forming surface and the back surface are shown in FIG. 8(a) and FIG. 8(b). FIG. 8(a) and the dashed line of FIG. 8(b) corresponds to a side view of the glass substrate before polishing by gas cluster ion beam etching is performed, and the solid line of FIG. 8(b) corresponds to a side view of the glass substrate after polishing by gas cluster ion beam etching is performed.

Comparative Example 2

Preliminary-polishing step, measurement step, corrective-polishing step, and finishing-polishing step were performed under the same conditions as those in Example 2, except that the corrective-polishing step was performed not only for the back surface of a $TiO_2$—$SiO_2$ glass substrate but also for both of the back surface and the film forming surface.

Total thickness distribution, flatness of both surfaces, and surface roughness of both surfaces of the obtained optical member base material for EUVL were measured in the same manner as that in Example 1, as a result, total thickness distribution was 43 nm, flatness of the film forming surface was 99 nm, flatness of the back surface was 96 nm, surface roughness (RMS) of the film forming surface was 0.1 nm, and surface roughness (RMS) of the back surface was 0.1 nm. defects on the film forming surface of the optical member base material for EUVL was evaluated by using automatic defect inspection machine M1320 made by Lasertec Corporation, as a result, the number of defects in a size of 150 nm or larger was 79. While defects and surface roughness of the film forming surface improved in comparison to Comparative Example 1, but the degrees are still unsatisfactory.

Comparative Example 3

The same procedure as that of Comparative Example 2 was performed, except that the polishing time for finishing-polishing was set to 60 minutes (the polishing amount was 0.11 μm/surface).

Total thickness distribution, flatness of both surfaces and surface roughness of both surfaces of the obtained optical member base material for EUVL were measured in the same manner as that in Example 1, as a result, total thickness distribution was 78 nm, flatness of the film forming surface was 156 nm, flatness of the back surface was 145 nm, surface roughness (RMS) of the film forming surface was 0.1 nm, and surface roughness (RMS) of the back surface was 0.1 nm. In addition, defect inspection for the film forming surface of the optical member base material for EUVL was performed using automatic defect inspection machine M1320 made by Lasertec Corporation, as a result, the number of defects in a size of 150 nm or larger was 0. Since the number of defects in a size of 150 nm or larger was 0, the number of defects in a smaller size of 70 nm or larger was evaluated in the same manner as that in Example 1, and as a result, the number of concave defects in a size of 70 nm or greater was 32, and the number of convex defects thereof was 20.

Example 3

In a photomask prepared by using the glass substrate (optical member base material for EUVL) obtained in Example 1, deviation of pattern position or pattern flaw did not arise in pattern position accuracy on the photomask or during pattern transfer.

Comparative Example 5

In a photomask prepared by using the glass substrate after polishing obtained in Comparative Example 3, deviation of pattern position or pattern flaw, which were not negligible, arose in pattern position accuracy on the photomask or during pattern transfer arose.

TABLE 1

|  | Total thickness distribution (nm) | Flatness (nm) | | Surface Roughness (nm) | | Number of Defects of 150 nm or larger (Substrate) | Number of Defects of 70 nm or larger | |
| --- | --- | --- | --- | --- | --- | --- | --- | --- |
|  |  | Film Forming Surface | Back surface | Film Forming Surface | Back surface | Total of Concave and Convex | (After Film Formation) | |
|  |  |  |  |  |  |  | Concave | Convex |
| Example 1 | 30 | 97 | 98 | 0.1 | 0.4 | 0 | 28 | 44 |
| Example 2 | 42 | 97 | 94 | 0.1 | 0.1 | 0 | 25 | 33 |
| Comparative Example 1 | 28 | 34 | 35 | 0.4 | 0.4 | 10000 | na | na |
| Comparative Example 2 | 43 | 99 | 96 | 0.1 | 0.1 | 79 | na | na |
| Comparative Example 3 | 78 | 156 | 145 | 0.1 | 0.1 | 0 | 37 | 44 |
| Comparative Example 4 | 280 | 120 | 205 | 0.1 | 0.1 | 0 | 32 | 20 | that in Example 1, and as a result, the number of concave defects in a size of 70 nm or larger was 23, and the number of convex defects thereof was 22. While the number of defects on the film forming surface of the optical member base material for EUVL decreased further by increasing the polishing amount in the finishing-polishing step, in comparison to Comparative Example 2, total thickness distribution and flatness deteriorated.

Comparative Example 4

An optical member base material for EUVL was produced in the same manner as that in Example 2, except that corrective-polishing was not performed.

Total thickness distribution, flatness of both surfaces and surface roughness of both surfaces of the obtained optical member base material for EUVL were measured in the same manner as that in Example 1, as a result, total thickness distribution was 280 nm, flatness of the film forming surface was 120 nm, flatness of the back surface was 205 nm, surface roughness (RMS) of the film forming surface was 0.1 nm, and surface roughness (RMS) of the back surface was 0.1 nm. In The present invention has been described in detail and with reference to specific examples, however, it is obvious for a person skilled in the art that various modifications and changes can be made without departing from the gist and the scope of the present invention.

The present application is based on Japanese Patent Application No. 2010-059199 filed on Mar. 16, 2010, and the content thereof is incorporated herein as reference.

REFERENCE SIGNS LIST

10: Optical member base material for EUVL (glass substrate)
11: Quality assurance area

The invention claimed is:
1. A method for producing an optical member base material for EUVL, comprising performing the following in this order to obtain an optical member base material for EUVL:
   a preliminary-polishing step of preliminarily polishing a film forming surface and a back surface of the film forming surface of a glass substrate;

a measuring step of measuring a total thickness distribution and a flatness of the glass substrate; and a corrective-polishing step of locally polishing only the back surface of the glass substrate depending on the measurement result of the measuring step.

2. The method for producing an optical member base material for EUVL according to claim 1, wherein the produced optical member base material for EUVL has flatness in a quality assurance area of the film forming surface and the back surface of 300 nm or less and the total thickness distribution of 45 nm or less.

3. The method for producing an optical member base material for EUVL according to claim 1, further comprising:

a finishing-polishing step of finishing-polishing at least the surface that has been subjected to the local polishing, after the corrective-polishing step.

4. The method for producing an optical member base material for EUVL according to claim 3, wherein the finishing-polishing step is a step of conducting polishing so as to achieve a surface roughness (RMS) of the film forming surface being 0.15 nm or less and a surface roughness (RMS) of the back surface of the film forming surface being 0.5 nm or less in the quality assurance area of the glass substrate.

5. The method for producing an optical member base material for EUVL according to claim 3, wherein a change in the total thickness distribution and a change in the flatness of the optical member for EUVL to be shown in the finishing-polishing step are taken into consideration in the corrective-polishing step.

6. The method for producing an optical member base material for EUVL according to claim 1, wherein, in the corrective-polishing step, any one polishing method selected from a group consisting of mechanical polishing, ion beam etching, gas cluster ion beam etching, plasma etching, MRF (Magnetorheological Finishing), and nano-abrasion by laser beam irradiation is used.

7. An optical member base material for EUVL, having, in a quality assurance area, a total thickness distribution of 45 nm or less, flatness of a film forming surface and a back surface of the film forming surface of 300 nm or less, and the number of defects having a size converted to a polystyrene latex particle diameter of 150 nm or larger, being 10 or fewer in the film forming surface.

8. A method for producing a multilayer reflective film-attached base material, comprising:

a step of obtaining an optical member base material for EUVL by the method for producing an optical member base material for EUVL according to claim 1; and a step of forming a multilayer reflective film that reflects EUV light, on a film forming surface of the optical member base material for EUVL.

9. A method for producing a reflective mask blank for EUVL, comprising:

a step of obtaining a multilayer reflective film-attached base material by the method for producing a multilayer reflective film-attached base material according to claim 8; and a step of forming an absorber layer that absorbs EUV light, on the multilayer reflective film of the multilayer reflective film-attached base material.

10. A method for producing a reflective photomask for EUVL, comprising:

a step of obtaining a reflective mask blank by the method for producing a reflective mask blank according to claim 9; and a step of forming an absorber pattern by patterning the absorber layer in the mask blank.

11. The method according to claim 1, wherein, in the preliminary-polishing step, a polishing method selected from the group consisting of a mechanical polishing method and a chemical polishing method is used, and the glass substrate is polished while supplying a polishing slurry containing an abrasive and water.

12. The method according to claim 11, wherein the polishing slurry comprises a cerium oxide.

13. The method according to claim 11, wherein the polishing slurry comprises a silicon oxide.

14. The method according to claim 13, wherein the silicon oxide comprises a colloidal silica.

15. The method according to claim 1, wherein, in the preliminary-polishing step, a beam irradiation or a laser beam irradiation is used.

16. The method according to claim 15, wherein the beam irradiation or the laser beam irradiation is selected from the group consisting of ion beam etching, gas cluster ion beam etching, plasma etching, and nano-abrasion by laser beam irradiation.

17. The method according to claim 1, wherein, in the preliminary- polishing step, a local polishing method in which a polishing amount can be arbitrarily set for each portion on the film forming surface or the back surface of the glass substrate is used.

18. The method according to claim 1, wherein, in the preliminary- polishing step, a local mechanical polishing method using a polishing pad with a smaller area than that of the glass substrate is used.

19. The method according to claim 1, wherein, in the preliminary-polishing step, a local polishing method using magnetic abrasive grains is used.

* * * * *